United States Patent [19]

Kos

[11] Patent Number: 5,207,324

[45] Date of Patent: May 4, 1993

[54] WAFER CUSHION FOR SHIPPERS

[75] Inventor: Robert D. Kos, Victoria, Minn.

[73] Assignee: Fluoroware, Inc., Chaska, Minn.

[21] Appl. No.: 666,357

[22] Filed: Mar. 8, 1991

[51] Int. Cl.⁵ ............................................. B65D 85/42
[52] U.S. Cl. .................................... 206/334; 206/453
[58] Field of Search ............. 206/334, 454, 453, 303; 211/40, 41

[56] References Cited

U.S. PATENT DOCUMENTS

| | | | |
|---|---|---|---|
| 4,043,451 | 8/1977 | Johnson | 206/334 |
| 4,061,228 | 12/1977 | Johnson | 206/334 |
| 4,450,960 | 5/1984 | Johnson | 206/334 |
| 4,520,925 | 6/1985 | Johnson | 206/334 |
| 4,588,086 | 5/1986 | Coe | 206/334 |
| 4,684,021 | 8/1987 | Niebling | 206/454 |
| 4,718,549 | 1/1988 | Rissotti et al. | 206/334 |
| 4,721,207 | 1/1988 | Kikuchi | 206/334 |
| 4,779,732 | 10/1988 | Boehm et al. | 206/334 |

*Primary Examiner*—Steven N. Meyers
*Assistant Examiner*—Thomas P. Hilliard
*Attorney, Agent, or Firm*—Palmatier, Sjoquist & Helget

[57] ABSTRACT

A wafer cushion for a wafer shipper that has bottom cavity adapted to support a plurality of axially aligned wafer therein. The shipper further has a cover releasably interlockably with the bottom to sealably enclose the wafers within the shipper for storage or transportation. The cushion comprises a frame adapted to be supported by the cover within the wafer shipper. A plurality of aligned pairs of flexible arms depend downwardly from the frame. A plurality of cushioning segments are each individually supported by one pair of the arms and thereby are adapted to supportably engage and grip the top edge of the wafers suitably at the wafers' top centerline.

11 Claims, 5 Drawing Sheets

5,207,324

WAFER CUSHION FOR SHIPPERS

BACKGROUND OF THE INVENTION

This invention relates to silicon wafers which are used in the manufacture of semiconductors, and more particularly, to a wafer cushion which bears down upon wafers within the shipper as well as securing the position of a wafer carrier, when used, within the shipper.

Wafers used in the semiconductor manufacturing process are typically made of silicon or gallium arsenide. The wafers are rather brittle and delicate in nature in that they are easily susceptible to breakage. Silicone wafers must also be kept in a clean environment free of dust and particulate matter. Foreign particulates interfere with the circuitry typically etched on the wafers which is extremely fine.

The silicon wafers undergo many stages of processing and it may be desirable to store and/or transport the silicon wafers during or after any or all of the processing steps. In such instances, the silicon wafers are often loaded into sealable shippers or shipping containers that will protect the brittle delicate wafers against damage and particular contamination. The following U.S. patents disclose such shippers: U.S. Pat. Nos. 4,043,451; 4,450,960; and 4,520,925.

Known past shippers do have many deficiencies which may result in a low yield of semiconductors from the silicon wafers contained within the shippers. That is, the wafers within known shippers are often not secured or fixed within the shippers resulting in breakage and further contamination of adjacent wafers. Furthermore, the wafers must be secured and not subjected to rubbing against any surfaces as such action will further cause particulate contamination and damage to the circuitry etched on the wafer.

Referring to FIGS. 1 and 2 as a matter of further background, wafers 8 typically have a peripheral edge 10 which either may be the flat indexing edge 12 or the round peripheral edge 10. The top edge 14 has a centerline which is used as a reference in this case.

Wafers 8 often are supported, carried, stored and transported in wafer carriers 16 as are well known. Wafer carriers or baskets 16 generally have an open top 18, sidewalls 20 with wafer supporting ribs, a front wall 22 with an indexing H-bar 24, a rear wall 26 and a top flange 28 along the sidewalls 20.

Shippers, as stated, are well known as the one illustrated in this case marked with the reference numeral 32. Shipper 32 has a bottom receptacle or cavity 34 with a carrier indexing structure or rib 36 located therewithin. Shippers 32 may also have a rib structure within their bottom cavity to support wafers without the need for a wafer carrier 16. Shipper 32 also has a top or cover 38 with an interior ceiling 40. The present invention contemplates ceiling 40 to have elongate slots 42 running longitudinally and having several transverse shorter slots 44 adjacent to slots 42. An alternative shipper 46 has a cover 48 also with a ceiling 50 having downwardly protruding buttons 52.

There is a need for a wafer cushion which may be used within a wafer shipper to supportably engage the wafers within the shipper to prohibit wafer movement which otherwise may generate particulate contamination and/or breakage. When a wafer carrier or basket is used with such a shipper, such a wafer cushion should secure the carrier within the shipper which otherwise may further increase contamination, particulate generation and breakage of the wafers.

SUMMARY OF THE INVENTION

A wafer cushion for a wafer shipper adapted to support a plurality of axially aligned wafers therein. The shipper further has a cover releasably interlockable with the bottom to sealably enclose the wafers within the shipper for storage or transportation. The cushion comprises a frame adapted to be supported by the cover within the wafer shipper. Individual cushioning portions are provided for each wafer. Each cushioning portion comprises a pair of flexible arms depending downwardly from the frame. Each cushioning portion includes a cushioning segment having a grooved wafer engaging face supported by one pair of the L-shaped arms and thereby adapted to supportably engage and grip the top edge of the wafers suitably at the wafers' top centerline.

A principal object and advantage of the present wafer cushion is that it is relatively simple, removable, inexpensive and thereby disposable after it has engaged and supported the wafers within the shipper, thereby minimizing the chances of further particulate generation and contamination which would result from repeated use and low yield in semiconductor manufacturing.

Another advantage and object of the present invention is that the wafer cushion restricts the wafer movement within its own plane as well as the transverse plane as the wafer cushion supportably grips the top edge of the wafer within the shipper without sliding contact to reduce wafer breakage, particulate generation and contamination of the wafer.

Another advantage and object of the present wafer cushion is that it bears down upon the wafer edge whether the particular edge portion is either round or flat as characteristic of silicon wafers. That is, the wafers require no particular orientation for the wafer cushion nor does the shipper necessitate being completely full of wafers for the wafer cushion to successfully perform.

Another object and advantage of the present wafer cushion is that it bears on the center of the wafer along the top centerline while the wafer is often further supported by offset sidewall structures, such as with wafer carriers. This arrangement provides for more uniform wafer support from three substantially equal distant points to further minimize wafer breakage.

Another advantage and object of the present invention is that the wafer cushion does not slidably engage or contact the wafers as with past cushions which greatly reduces particulate generation and contamination to the semi-conductors.

Yet another advantage and object of the present invention is that the wafer cushion provides a hold down for a wafer carrier basket placed within the shipper as to secure the carrier within the shipper when the shipper's cover is interlocked with the bottom to further limit wafer breakage and contamination.

DETAILED SPECIFICATION

Figure 1:
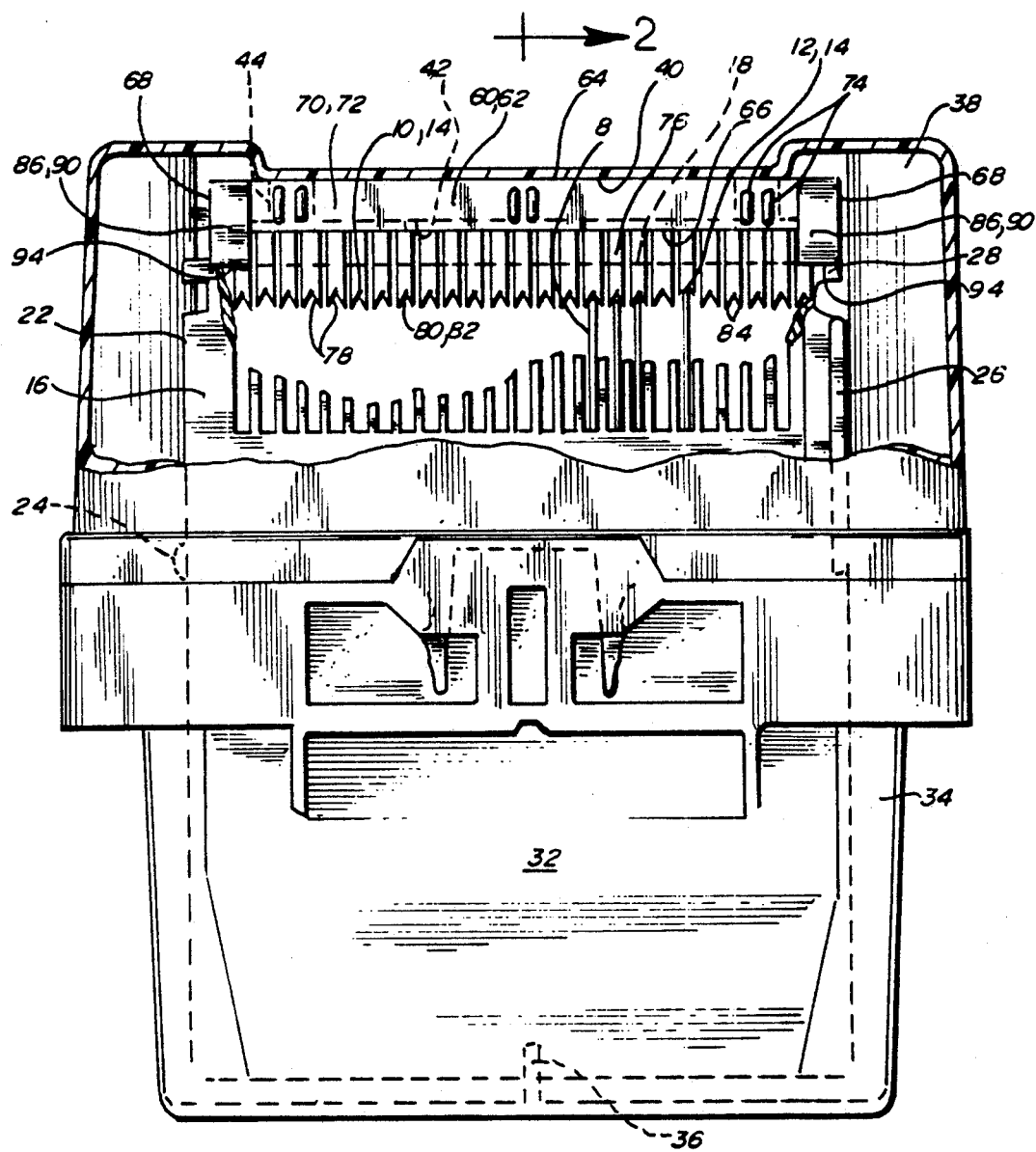
FIG. 1 is a side elevational view of a shipper with a wafer carrier therein shown in minimum detail to include side elevational view of the present wafer cushion supported by the top cover of the shipper as the shipper and carrier are partially broken away.
Figure 5:
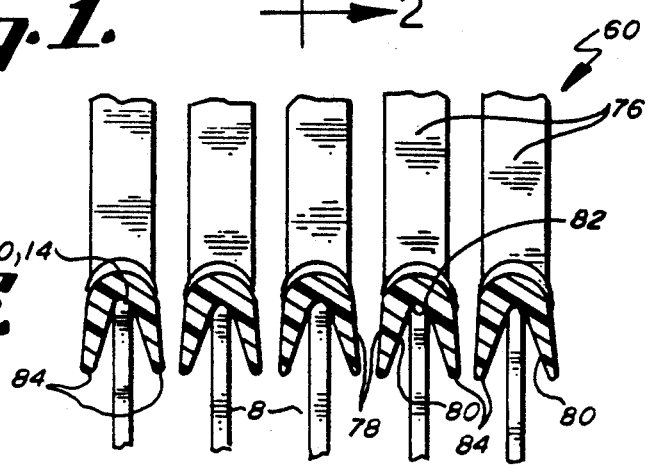
FIG. 5 is a cross sectional view of the cushioning segments broken away and taken along lines 5—5 of FIG. 4.
Figure 2:
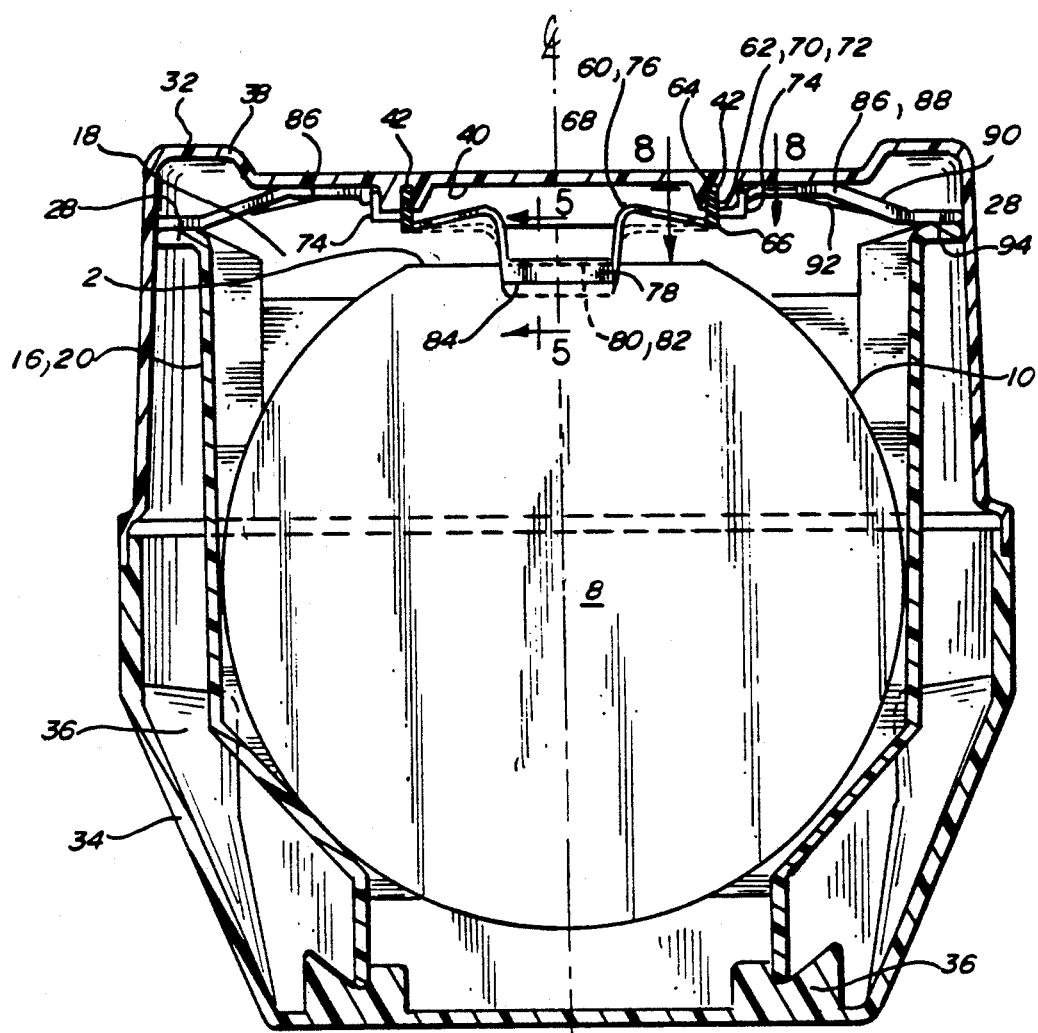
FIG. 2 is a cross sectional view taken along lines 2—2 of FIG. 1 showing the wafer cushion engaging and gripping a silicon wafer while holding the wafer carrier down within the shipper.

Referring to FIGS. 1-8, the wafer cushion 60 may generally be seen. The cushion 60 generally includes a frame 62, pairs of independent arms 76 which support independent cushioning segments 78 and support legs 86. The wafer cushion 60 is appropriately molded as a one piece, unitary or integral construction out of a suitable plastic material such as polypropylene or polycarbonate.

More particularly, the wafer cushion 60 has a frame 62 with a top surface 64 and bottom surface 66. Frame 62 has ends 68 and sides 70. The top surface 64 of sides 70 form rails 72 which project upwardly and are alignable with slots 42 of shipper 32. Along rails 72 and sides 70 are protruding lugs, tabs or ears 74 which assist in indexing the frame 62 into the ceiling 40 of the shipper 32 by alignment within transverse slots 44.

Extending generally downward from the frame 62 are a plurality of aligned pairs of flexible arms 76. There is one pair of depending arms 76 for each wafer 8 to be placed within the shipper 32. As seen by the figures, arms 76 suitably depend inwardly and then downwardly to appear as L-shaped.

Independent cushioning segments 78 extend across from the ends of each independent pair of arms 76 as to create a single independent cushioning segment 78 for each individual wafer. Independent cushioning segments 78 are relatively stiff for bearing downwardly and gripping the top edge 14 of the of wafer 8 along the top centerline (designated $\mathcal{C}$). The underside of cushioning segments 78 has a notch, groove, channel or indentation 80 therealong which is suitably elongate and parallel to the plane of the wafers 8. Notch 80 appropriately has an inner radius 82 to conform to the peripheral edge 10 of the wafers. Adjacent the inner radius 82 of notch 80 are the depending and opposing tips 84.

Wafer cushion 60 also appropriately has support legs 86 which are intended to bear down upon a wafer carrier 16 within a shipper 32 as to secure the carrier 16 in the bottom cavity 34 to prevent its movement or rattling within the shipper 32. Support legs 86 are located along the adjacent ends 68 and sides 70 of the frame 62. Each of the four legs 86 have a first outwardly extending portion 88 and a second outwardly and downwardly extending portion 90. By this construction, support legs 86 have a bias in the downwardly direction. Between the first portion 88 and the second portion 90 on their undersides are intermediate gussets 92 which further add strength to the legs 86. At the end of the second extending portion 90 are located carrier flange contact feet 94.

The structure, operation and appreciation of the wafer cushion 60 may now be appreciated. Initially, the frame 62 has its top rails 72 located into slots 42 of the ceiling 40 of the top 38 of shipper 32. Lugs 74 are aligned with transverse slots 44. A wafer carrier 16 with a load of wafers 8 therein is next indexed into the bottom cavity 34 of shipper 32. Thereafter, top 38 is placed over the bottom cavity 34 and pushed downwardly to innerlock the bottom 34 and top 38. By this action, the individual cushion segments 78 aligned above the individual wafers 8 are brought down to bear upon and grip the peripheral edge of the wafers 8 within the wafer carrier 16 whether the peripheral edge 10 is flat or round. Simultaneously, the support legs 86 bear down upon the top flanges 28 of the wafer carrier 16 to hold wafer carrier 16 down within the bottom cavity 34 of shipper 32. Thereafter, the shipper 32 may be transported or stored.

Figure 10:
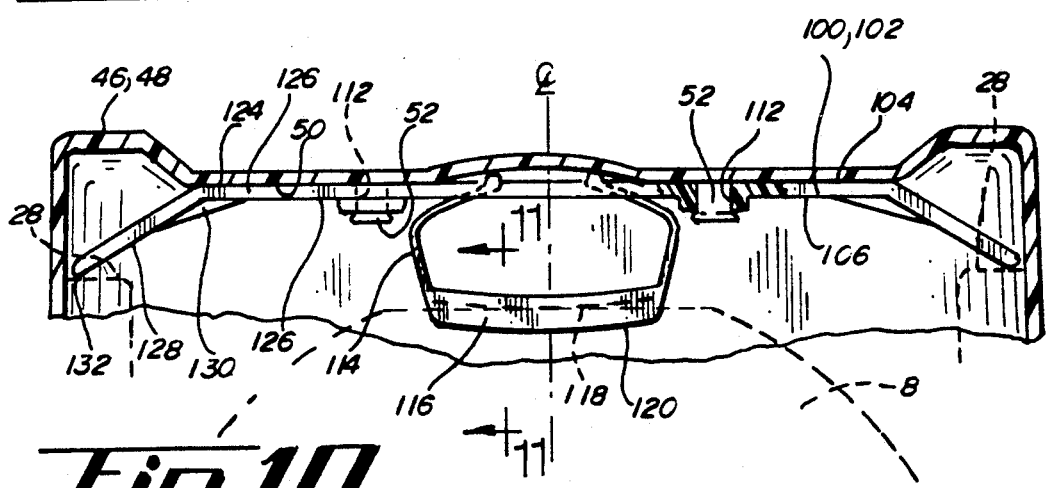
FIG. 10 is a partially broken away cross sectional view taken along lines 10—10 of FIG. 9.
Figure 3:
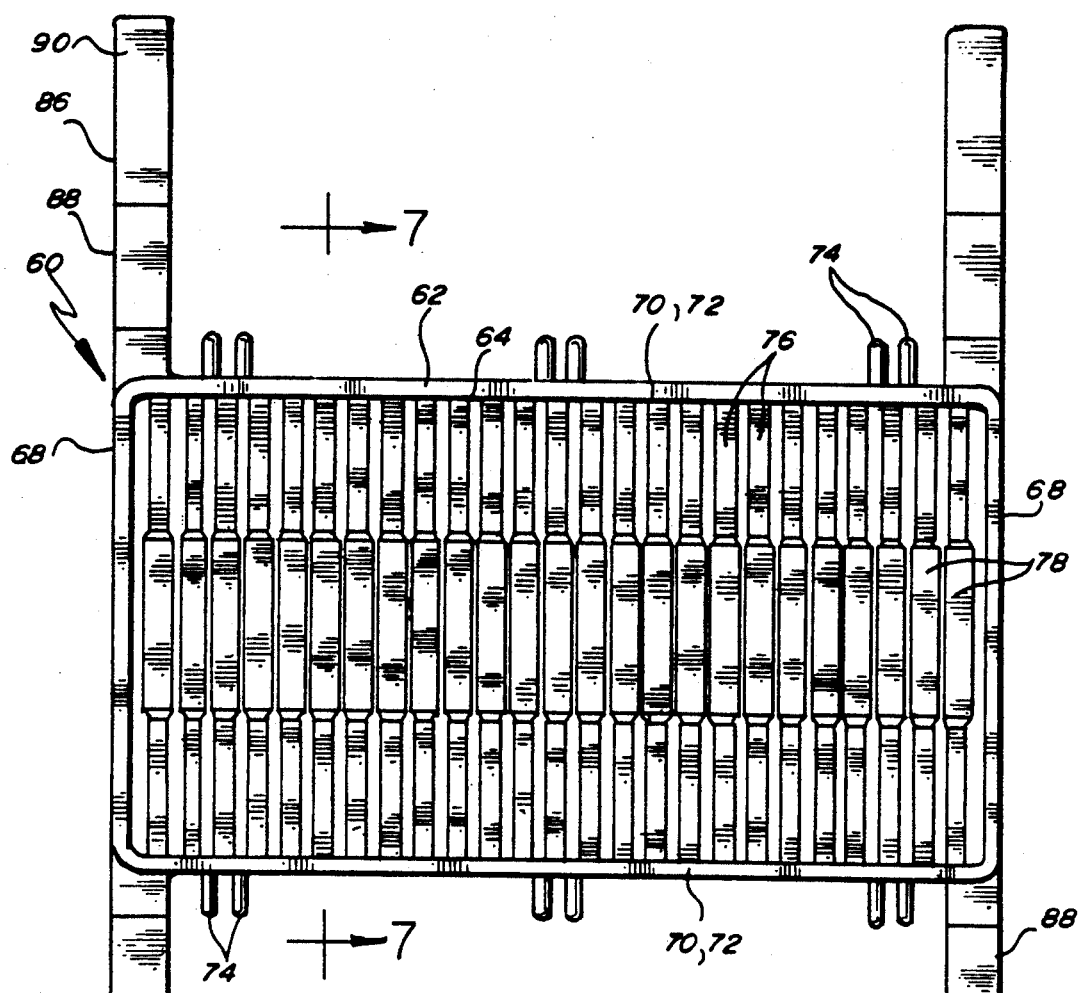
FIG. 3 is a top plan view of the wafer cushion.
Figure 4:
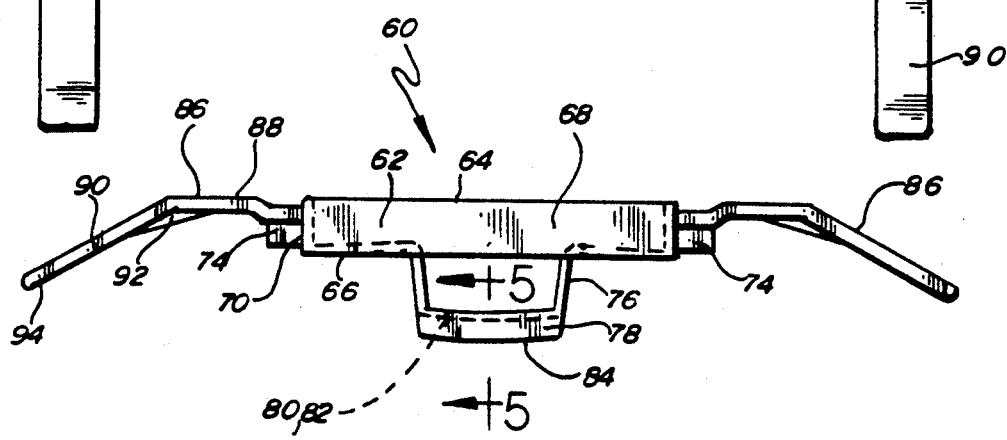
FIG. 4 is an end elevational view of the wafer cushion.
Figure 6:
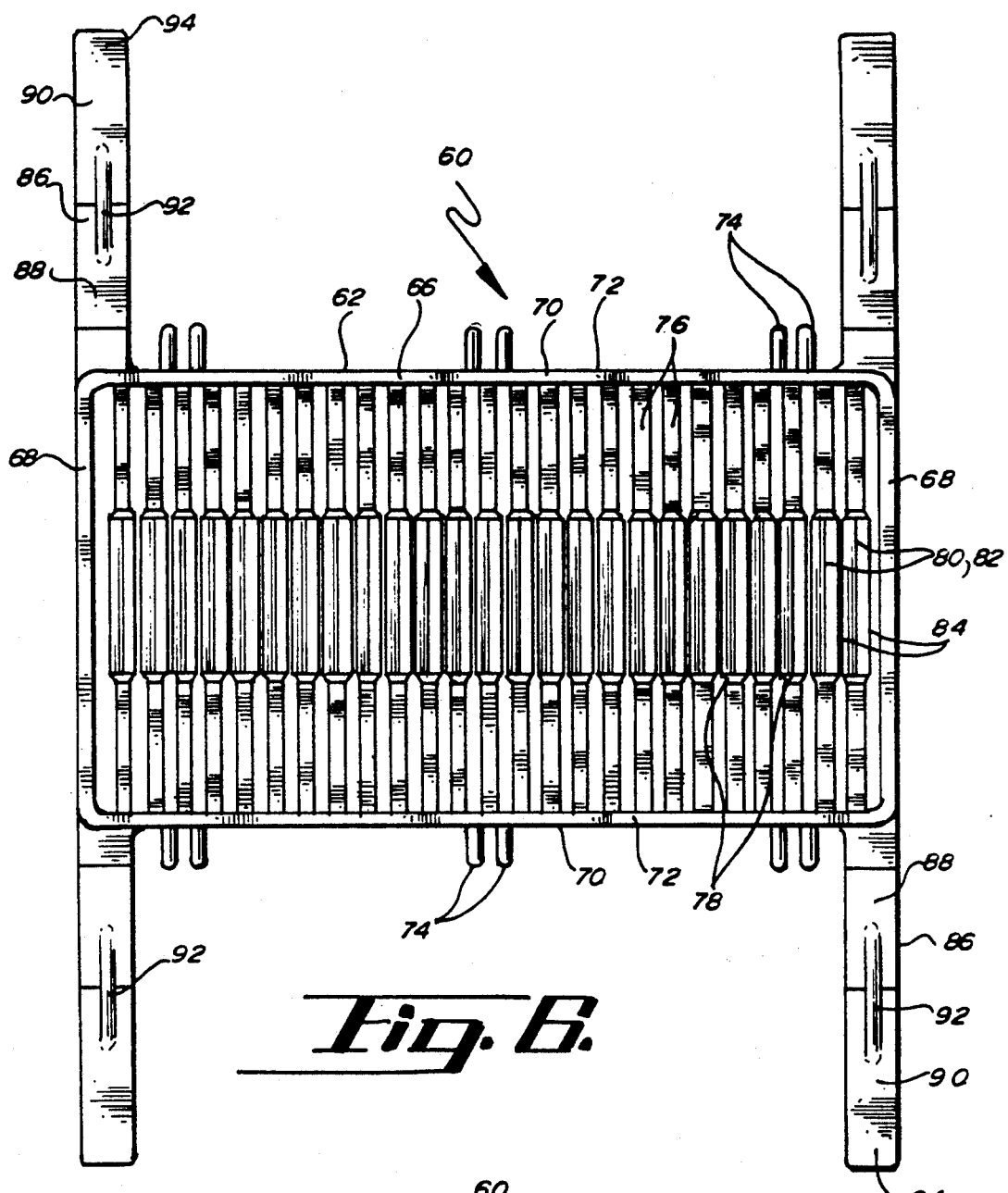
FIG. 6 is a bottom view of the wafer cushion.
Figure 7:
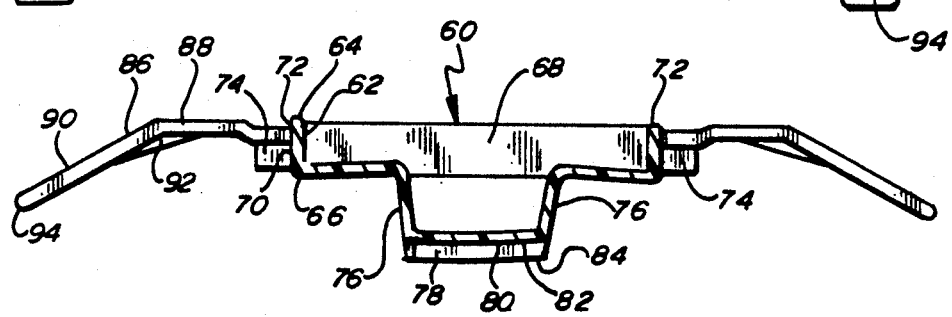
FIG. 7 is a cross sectional view of the wafer cushion taken along lines 7—7 of FIG. 3.
Figure 8:
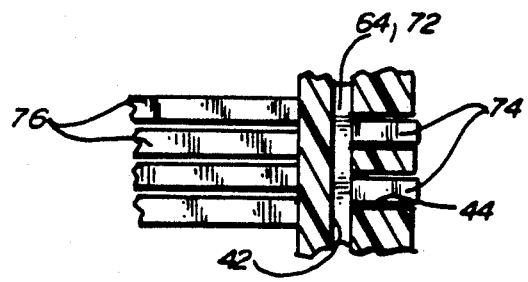
FIG. 8 is a broken away cross sectional view taken along lines 8—8 of FIG. 2.
Figure 11:
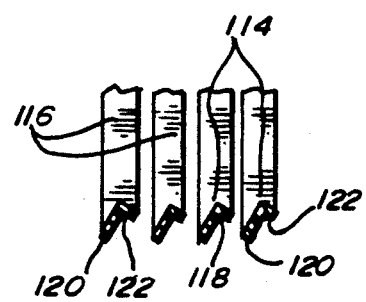
FIG. 11 is a cross sectional view partially broken away taken along lines 11—11 of FIG. 10.
Figure 9:
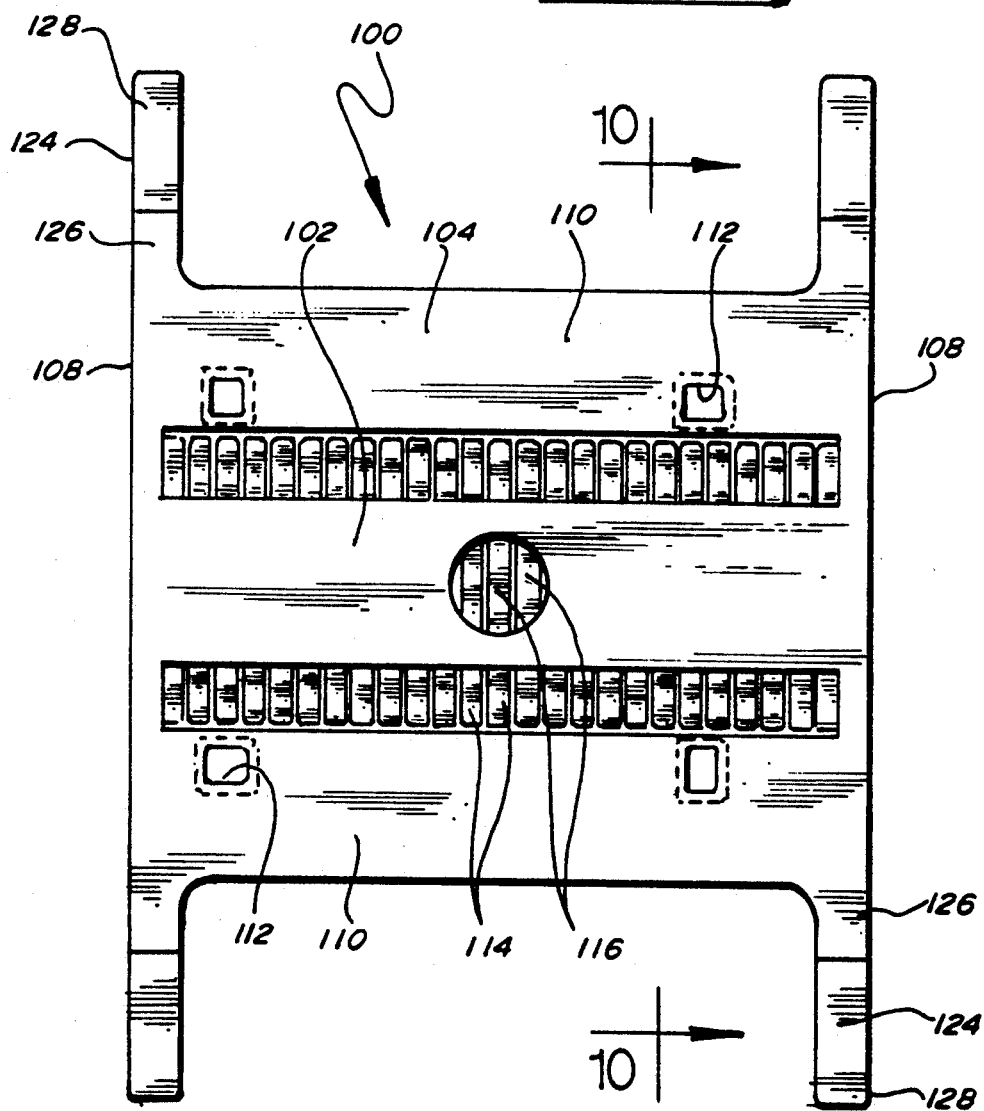
FIG. 9 is a top plan view of another embodiment of the present wafer cushion.

The alternate shipper 46 may utilize a modified wafer cushion 100 as shown in FIGS. 9-11. The wafer cushion 100 has a frame 102 with a top surface 104 and a bottom surface 106. The frame 102 also has ends 108 and sides 110. Button holes 112 pass through the frame 102 which are alignable with buttons 52 of shipper 46.

Independently flexible arms 114 are also L-shaped and extend outwardly and then downwardly and inwardly where their ends are bridged or connected by independent wafer cushioning segments 116. Segments 116 appropriately have elongate notches or channels 118 therein with depending tips 120 and 122 which may be of various heights.

Wafer carrier hold down legs 124 suitably have first outwardly extending portions 126 and second outwardly and downwardly extending portions 128 with an intermediate gusset 130 on their undersides. Feet 132 of legs 124 engage the flanges 28 of a wafer carrier 16.

The present invention may be embodied in other specific forms without departing from the spirit or essential attributes thereof; therefore, the illustrated embodiment should be considered in all respects as illustrative and not restrictive, reference being made to the appended claims rather than to the foregoing description to indicate the scope of the invention.

What is claimed:

1. A semiconductor wafer shipping and storage container to engage such wafers only at their edge portions, comprising an elongate bottom receptacle portion with engaging means engaging and supporting such wafers at their edge portions and maintaining the wafers in spaced and confronting relation with each other, and said engaging means orienting the wafers transversely of the elongate bottom receptacle, an elongate cover portion for the receptacle portion and removably secured thereto, the cover portion comprising an inner side facing the bottom receptacle portion, an elongate frame portion demountably secured on the inner side of the cover portion, a plurality of stiff and elongate wafer engaging cushioning segments arranged in side-by-side relation to each other and also arranged in adjacent and spaced relation to the inner side of the cover portion and opposite the bottom receptacle portion, each of said elongate cushioning segments extending transversely of the elongate bottom receptacle portion and transversely of the elongate frame and each of said cushioning segments comprising an engaging face to bear against the edge portion of one of such wafers, each of said elongate cushioning segments having opposite end portions and each of the said elongate cushioning segments being movable toward and away from the inner side of the cover portion, a plurality of pairs of resiliently flexible mounting arms mounting the cushioning segments on the frame, the mounting arms in each pair of mounting arms being secured to and respectively extending from said opposite end portions of a cushioning segment, and said mounting arms also extending to and being secured to said frame portion, the mounting arms resiliently flexing as the cushioning segments engage the edge portions of the wafers to accommodate movement of the cushioning segments toward the inner side of the cover portion and to continuously and resiliently urge the cushioning segments against the edge portions of the wafers.

2. The container of claim 1, wherein said elongate bottom receptacle portion and cover portion comprise sidewalls between which the wafers are stored, said engaging means of the receptacle portion comprise supporting ribs defining wafer confining spaces therebetween for the wafers, there being only a single wafer engaging cushioning segment opposite each wafer confining space, and each cushioning segment being located approximately midway between said sidewalls to engage a wafer in the corresponding wafer confining space at a location approximately midway between the sidewalls.

3. The container of claim 1 wherein the flexible mounting arms comprise generally L-shaped portions to flex and urge the cushioning segments against the edge portions of the wafers.

4. The container of claim 3 wherein said flexible mounting arms comprise generally upright portions extending toward the inner side of the cover portion and being connected to end portions of the cushioning segments.

5. The container of claim 3 wherein said flexible arms comprise generally horizontal portions extending substantially in the direction of the elongate cushioning segments and extending adjacent to and connected to the frame.

6. The container of claim 1 wherein each of said cushioning segments are suspended by a pair of mounting arms, and each of the segments engages the wafer at its centerline.

7. The container of claim 1, wherein the engaging faces of the cushioning segments comprise grooves for receiving the edge portions of the wafers.

8. The container of claim 1, wherein said engaging means of the bottom receptacle portion comprises a wafer carrier with sidewall top flanges, at least two resiliently flexible wafer carrier hold down legs affixed to said elongate frame portion and extending transversely therefrom in opposite directions and outwardly and downwardly from the frame portion and into engagement with the top flanges of the carrier to hold down the carrier within the bottom receptacle portion when the cover is secured to the bottom receptacle portion.

9. The container of claim 8, wherein the hold down legs each comprise first and second outwardly extending portions, said first portion extending transversely of and from the frame portion and engaging the inner side of the cover portion, and said second portion extending from said first portion and obliquely downwardly and into engagement with and in overlying relation with the carrier flange to hold the carrier down in the bottom receptacle portion.

10. The container of claim 9, further comprising an intermediate strengthening gusset between the first and the second outwardly extending portions.

11. The container of claim 1, wherein the inner side of the cover portion comprises means defining slots therein and the frame portion has upwardly extending rails interlockable within the slots.

* * * * *